United States Patent
Ogawa et al.

(10) Patent No.: US 7,049,731 B2
(45) Date of Patent: May 23, 2006

(54) PIEZOELECTRIC CERAMIC COMPOSITION AND PIEZOELECTRIC CERAMIC DEVICE COMPOSED OF SAME

(75) Inventors: Hirozumi Ogawa, Shiga-ken (JP); Masahiko Kimura, Kusatsu (JP); Tatsuya Yamaguchi, Yono (JP); Akira Ando, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 163 days.

(21) Appl. No.: 10/831,195

(22) Filed: Apr. 26, 2004

(65) Prior Publication Data

US 2004/0251791 A1 Dec. 16, 2004

(30) Foreign Application Priority Data

May 21, 2003 (JP) ............................. 2003-143086

(51) Int. Cl.
*H01L 41/187* (2006.01)
*C04B 35/01* (2006.01)

(52) U.S. Cl. ...................... 310/358; 310/320
(58) Field of Classification Search ............... 310/358, 310/320
See application file for complete search history.

(56) References Cited

U.S. PATENT DOCUMENTS 6,369,488 B1 * 4/2002 Ando et al. ............. 310/320
2002/0060306 A1 * 5/2002 Nishida et al. ......... 252/62.9 R

FOREIGN PATENT DOCUMENTS

| CN | 1336347 A | 2/2002 |
|---|---|---|
| EP | 0 820 968 A1 | 1/1998 |
| EP | 0 875 493 A1 | 11/1998 |
| JP | 2000-281443 | 10/2000 |
| JP | 2001-130960 | 5/2001 |
| JP | 2001-181040 | 7/2001 |
| JP | 2001-328865 | 11/2001 |
| JP | 2001-345669 | 12/2001 |
| JP | 2003-176176 | 6/2003 |
| JP | 2003-201174 | * 7/2003 |

OTHER PUBLICATIONS

Forbess et al., Applied Physics Letters, vol. 76, No. 20, pp. 2934-2936 (2000).
Copy of The People's Republic of China Office Action dated Sep. 16, 2005 (and English translation of same).

* cited by examiner

*Primary Examiner*—Thomas M. Dougherty
(74) *Attorney, Agent, or Firm*—Dickstein, Shapiro, Morin & Oshinsky, LLP

(57) ABSTRACT

A piezoelectric ceramic composition that is based on a layered bismuth compound composed of Sr, Bi, Nb, oxygen, contains an additional monovalent metallic element. The piezoelectric ceramic composition has an elevated Curie point, is highly reliable at higher temperatures, that is, minimizes the reduction in the piezoelectric effect, and is useful as a material for piezoelectric ceramic devices that contain little or no lead or lead compounds. The layered bismuth compound contains not more than about 0.125 mol and more than 0 mol of the monovalent metallic element for 1 mol of Nb.

20 Claims, 1 Drawing Sheet ature range, for example, from 60° C. to 200° C.,
PIEZOELECTRIC CERAMIC COMPOSITION AND PIEZOELECTRIC CERAMIC DEVICE COMPOSED OF SAME

BACKGROUND OF THE INVENTION

1. Field of the Invention

The present invention relates to a piezoelectric ceramic composition and a piezoelectric ceramic device composed of the piezoelectric ceramic composition. In particular, the present invention relates to a piezoelectric ceramic composition that is useful as a material for piezoelectric ceramic devices, such as a piezoelectric ceramic filter, a piezoelectric ceramic resonator and a piezoelectric ceramic oscillator, and to a piezoelectric ceramic device composed of the piezoelectric ceramic composition.

2. Description of the Related Art

Hitherto, a lead zirconate titanate, $(Pb(Ti_xZr_{1-x})O_3)$ or a lead titanate- $(PbTiO_3)$ based piezoelectric ceramic composition has been widely used in piezoelectric ceramic devices, such as a piezoelectric ceramic filter, a piezoelectric ceramic resonator and a piezoelectric ceramic oscillator. However, the lead zirconate titanate- or the lead titanate-based piezoelectric ceramic composition contains a large amount of lead, which vaporizes as lead oxide during production of the piezoelectric ceramic device, and thereby results in poor product uniformity. Thus, a piezoelectric ceramic composition that contains little or no lead is desired to overcome this problem. In addition, a lower amount of lead is also desirable in view of environmental pollution.

On the other hand, a piezoelectric ceramic composition based on a layered bismuth compound, such as $SrBi_2Nb_2O_9$, is free of lead oxide and does not cause such problems.

In addition, $SrBi_2Nb_2O_9$-based materials, as disclosed in Japanese Unexamined Patent Application Publication No. 2001-328865, exhibit a significantly small change in frequency when temperature changes, and therefore have received attention as piezoelectric materials for resonators recently.

While the piezoelectric ceramic device is typically used at a temperature range, for example, from 60° C. to 200° C., those that can be used at a higher temperature of, for example, about 400° C., are desired for use in a resonator. Since the piezoelectric ceramic resonator cannot be used above its Curie point, where it has no piezoelectric effect, the piezoelectric ceramic resonator must has a Curie point higher than operating temperatures.

According to M. J. Forbess et al. (Applied Physics Letters, Vol. 76, 2943, (2000)), $SrBi_2Nb_2O_9$ has a Curie point of 418° C. and has a lowered piezoelectric effect when used for a piezoelectric ceramic resonator at a temperature close to 400° C. A preferred Curie point in this case is at least 430° C.

SUMMARY OF THE INVENTION

Accordingly, it is an object of the present invention to provide a piezoelectric ceramic composition that is based on a layered bismuth compound composed of Sr, Bi, Nb, oxygen, and an additional monovalent metallic element. The piezoelectric ceramic composition has an elevated Curie point, is highly reliable at higher temperatures, that is, minimizes the reduction in the piezoelectric effect, and is useful as a material for piezoelectric ceramic devices that contain little or no lead or lead compounds.

The piezoelectric ceramic composition according to the present invention contains not more than about 0.125 mol (and more than 0 mol) of monovalent metallic element per 1 mol of Nb. This amount of monovalent metallic element leads to an increased Curie point of the piezoelectric ceramic composition. However, more than about 0.125 mol of monovalent metallic element will adversely decrease the Curie point of the piezoelectric ceramic composition.

Preferably, the monovalent metallic element used in the present invention is at least one selected from the group consisting of Li, Na and K, which give further advantages of the present invention.

Furthermore, the piezoelectric ceramic composition according to the present invention preferably contains not more than about 0.175 mol (and more than 0 mol) of trivalent metallic element other than Bi per 1 mol of Nb. When the ceramic device composed of the piezoelectric ceramic composition is used as a resonator, this amount of trivalent metallic element other than Bi gives a practicable $Q_{max}$ factor (the maximum electrical quality factor Q (1/tan δ) within a band, that is, at frequencies between the resonance frequency and the anti-resonance frequency).

Preferably, the trivalent metallic element other than Bi is at least one selected from the group consisting of Sc, Y, La, Ce, Nd, Sm, Gd, Dy, Er and Yb, which give further advantages of the present invention. More preferably, the trivalent metallic element other than Bi is Nd, which give still further advantages of the present invention.

In the main component of the piezoelectric ceramic composition according to the present invention, not more than about 10 molar percent (and more than 0 molar percent) of Nb may be replaced with Ta. As a result, the amount of Ta will be up to 10% based on the total mols of Nb and Ta present. Replacing more than about 10 molar percent of Nb with Ta will result in a too low $Q_{max}$ factor for the piezoelectric ceramic composition to function as a resonator.

Further, the main component of the piezoelectric ceramic composition according to the present invention may contain not more than about 0.01 mol (and more than 0 mol) of Mn per 1 mol of the main component. Manganese in amounts larger than that will result in a too low $Q_{max}$ factor for the piezoelectric ceramic composition to function as a resonator.

The piezoelectric ceramic device according to the present invention includes a piezoelectric ceramic that is composed of piezoelectric ceramic composition according to the present invention, and electrodes on the piezoelectric ceramic.

The foregoing and other objects, features, and advantages of the present invention will be more apparent from the detailed description of the following embodiment according to the present invention.

DESCRIPTION OF THE PREFERRED EMBODIMENTS $SrCO_3$, $Bi_2O_3$, $Nb_2O_5$, $Ta_2O_5$, $Na_2CO_3$, $K_2CO_3$, $Li_2CO_3$, $Nd_2O_3$, $La_2O_3$, $Ce_2O_3$, $Sc_2O_3$, $Y_2O_3$, $Sm_2O_3$, $Gd_2O_3$, $Dy_2O_3$, $Er_2O_3$, $Yb_2O_3$ and $MnCO_3$ were firstly prepared as starting materials. These compounds were weighed to meet the composition formula $(Sr_aBi_bNb_cO_9+w$ mol M1+x mol M3+y mol Ta+z mol $MnCO_3$ (wherein, M1 is Na, K or Li, M3 is Nd, La, Ce, Sc, Y, Sm, Gd, Dy, Er or Yb, and a, b, c, w, x, y and z are as shown in Tables 1 and 2)) and were wet-blended in a ball mill for about 16 hours. The resulting mixture was dried, and was then calcined at 800 to 1000° C. The product was mixed with an organic binder, a dispersant, an anti-foaming agent, a surfactant and pure water in proper quantities, and was pulverized in the ball mill. The resulting slurry was applied with a doctor blade into sheets 40 to 80 μm in thickness. Electrodes were printed on some of these sheets with a Pt paste, and then the printed sheets were dried. The printed sheets and other sheets were stacked. The resulting laminate was compacted and was baked at 1100 to 1300° C. Then, the laminate was polarized in an insulating oil at 100 to 200° C. under 5 to 10 kV/mm dc voltage for 10 to 30 min, yielding an energy-confinement piezoelectric ceramic oscillator 10 (sample) shown in FIGS. 1 and 2.

Figure 1:
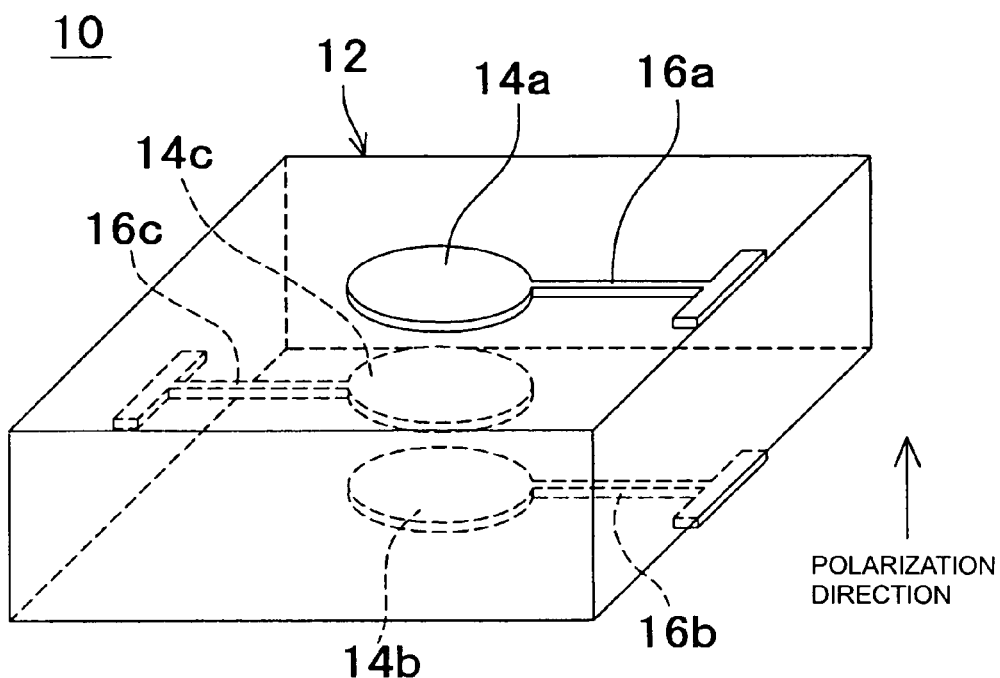
FIG. 1 is a perspective view of a piezoelectric ceramic oscillator according to an embodiment of the present invention.
Figure 2:
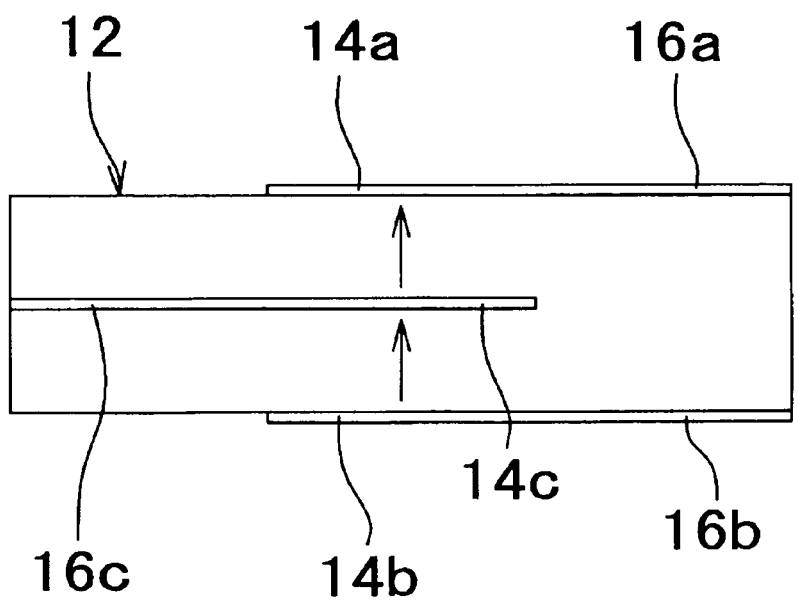
FIG. 2 is a sectional view of the piezoelectric ceramic oscillator shown in FIG. 1.

A piezoelectric ceramic oscillator 10 shown in FIGS. 1 and 2 includes a piezoelectric ceramic 12 in, for example, a rectangular parallelepiped shape. The piezoelectric ceramic 12 is polarized in the direction from the bottom face to the top face as indicated by an arrow. The piezoelectric ceramic 12 has vibrating electrodes 14a and 14b on its top and bottom faces, respectively. The vibrating electrodes 14a and 14b are of, for example, a circular shape and are disposed at the center of each face. Thus, the vibrating electrode 14b is disposed right below the vibrating electrode 14a. The piezoelectric ceramic 12 also has an internal vibrating electrode 14c in, for example, a circular shape. The vibrating electrode 14c is disposed in the middle of the vibrating electrodes 14a and 14b. Thus, the vibrating electrodes 14a, 14b and 14c are vertically aligned. Leading electrodes 16a, 16b and 16c in, for example, a T shape are disposed between their respective vibrating electrodes 14a, 14b and 14c, and a side face of the piezoelectric ceramic 12. Specifically, the leading electrodes 16a and 16b are disposed between their respective vibrating electrodes 14a and 14b, and one side face of the piezoelectric ceramic 12, and the leading electrode 16c is disposed between the vibrating electrode 14c and the other side face of the piezoelectric ceramic 12. A voltage is applied between the leading electrodes 16a and 16b and the leading electrode 16c to cause electric potential difference between the exterior vibrating electrodes 14a and 14b and the interior vibrating electrode 14c, and thus to excite a thickness-longitudinal vibration second harmonic mode.

The piezoelectric ceramic oscillator 10 (sample) was tested for the $Q_{max}$ factor at room temperature in the thickness-longitudinal vibration second harmonic mode. In addition, the temperature dependence of permittivity and the Curie point were measured. The results are shown in Tables 1 and 2.

TABLE 1

Samples with asterisks are outside of the scope of the present invention.

| Sample No. | a | b | c | M1 | w | M3 | x | y | z | w/c | x/c | Curie point (° C.) | $Q_{max}$ |
|---|---|---|---|---|---|---|---|---|---|---|---|---|---|
| 1* | 1.0 | 2.0 | 2.0 | — | 0 | — | 0 | 0 | 0 | 0 | 0 | 418 | 9.8 |
| 2 | 1.0 | 2.0 | 2.0 | Na | 0.05 | — | 0 | 0 | 0 | 0.025 | 0 | 480 | 10.1 |
| 3 | 1.0 | 2.0 | 2.0 | Na | 0.1 | — | 0 | 0 | 0 | 0.05 | 0 | 480 | 10.5 |
| 4 | 1.0 | 2.0 | 2.0 | Na | 0.2 | — | 0 | 0 | 0 | 0.1 | 0 | 455 | 10.4 |
| 5 | 1.0 | 2.0 | 2.0 | Na | 0.25 | — | 0 | 0 | 0 | 0.125 | 0 | 435 | 10.3 |
| 6* | 1.0 | 2.0 | 2.0 | Na | 0.3 | — | 0 | 0 | 0 | 0.15 | 0 | 360 | 9.6 |
| 7 | 1.0 | 2.0 | 2.0 | K | 0.1 | — | 0 | 0 | 0 | 0.05 | 0 | 480 | 10.2 |
| 8 | 1.0 | 2.0 | 2.0 | K | 0.2 | — | 0 | 0 | 0 | 0.1 | 0 | 450 | 10.5 |
| 9* | 1.0 | 2.0 | 2.0 | K | 0.3 | — | 0 | 0 | 0 | 0.15 | 0 | 370 | 8.9 |
| 10 | 1.0 | 2.0 | 2.0 | Li | 0.1 | — | 0 | 0 | 0 | 0.05 | 0 | 480 | 9.8 |
| 11 | 1.0 | 2.0 | 2.0 | Li | 0.2 | — | 0 | 0 | 0 | 0.1 | 0 | 435 | 10.3 |
| 12* | 1.0 | 2.0 | 2.0 | Li | 0.3 | — | 0 | 0 | 0 | 0.15 | 0 | 370 | 8.6 |
| 13 | 1.0 | 2.0 | 2.0 | Na | 0.05 | Nd | 0.05 | 0 | 0 | 0.025 | 0.025 | 490 | 12.5 |
| 14 | 1.0 | 2.0 | 2.0 | Na | 0.1 | Nd | 0.2 | 0 | 0 | 0.05 | 0.1 | 470 | 11.5 |
| 15 | 1.0 | 2.0 | 2.0 | Na | 0.1 | Nd | 0.35 | 0 | 0 | 0.05 | 0.175 | 450 | 10.3 |
| 16 | 1.0 | 2.0 | 2.0 | Na | 0.1 | Nd | 0.4 | 0 | 0 | 0.05 | 0.2 | 435 | 8.9 |
| 17 | 0.9 | 2.0 | 2.0 | Na | 0.1 | Nd | 0.1 | 0 | 0 | 0.05 | 0.05 | 470 | 15.2 |
| 18 | 0.8 | 2.0 | 2.0 | Na | 0.1 | Nd | 0.2 | 0 | 0 | 0.05 | 0.1 | 465 | 12.3 |
| 19 | 0.8 | 2.0 | 2.0 | Na | 0.15 | Nd | 0.3 | 0 | 0 | 0.075 | 0.15 | 460 | 11.4 |
| 20 | 0.8 | 2.2 | 2.0 | Na | 0.15 | Nd | 0.3 | 0 | 0 | 0.075 | 0.15 | 470 | 13.3 |
| 21 | 0.9 | 2.0 | 2.0 | Na | 0.1 | La | 0.1 | 0 | 0 | 0.05 | 0.05 | 460 | 14.6 |

TABLE 2

| Sample No. | a | b | c | M1 | w | M3 | x | y | z | w/c | x/c | Curie point (° C.) | $Q_{max}$ |
|---|---|---|---|---|---|---|---|---|---|---|---|---|---|
| 22 | 0.8 | 2.0 | 2.0 | Na | 0.1 | La | 0.2 | 0 | 0 | 0.05 | 0.1 | 440 | 13.2 |
| 23 | 0.9 | 2.0 | 2.0 | Na | 0.1 | Sc | 0.1 | 0 | 0 | 0.05 | 0.05 | 470 | 14.3 |
| 24 | 0.8 | 2.0 | 2.0 | Na | 0.1 | Sc | 0.2 | 0 | 0 | 0.05 | 0.1 | 460 | 13.2 |
| 25 | 0.9 | 2.0 | 2.0 | Na | 0.1 | Y | 0.1 | 0 | 0 | 0.05 | 0.05 | 475 | 15.5 |
| 26 | 0.8 | 2.0 | 2.0 | Na | 0.1 | Y | 0.2 | 0 | 0 | 0.05 | 0.1 | 460 | 14.1 |
| 27 | 0.9 | 2.0 | 2.0 | Na | 0.1 | Sm | 0.1 | 0 | 0 | 0.05 | 0.05 | 470 | 13.5 |
| 28 | 0.8 | 2.0 | 2.0 | Na | 0.1 | Sm | 0.2 | 0 | 0 | 0.05 | 0.1 | 455 | 12.8 |
| 29 | 0.9 | 2.0 | 2.0 | Na | 0.1 | Dy | 0.1 | 0 | 0 | 0.05 | 0.05 | 470 | 14.3 |
| 30 | 0.8 | 2.0 | 2.0 | Na | 0.1 | Dy | 0.2 | 0 | 0 | 0.05 | 0.1 | 460 | 13.7 |
| 31 | 0.9 | 2.0 | 2.0 | Na | 0.1 | Yb | 0.1 | 0 | 0 | 0.05 | 0.05 | 475 | 13.9 |

TABLE 2-continued

| Sample No. | a | b | c | M1 | w | M3 | x | y | z | w/c | x/c | Curie point (° C.) | $Q_{max}$ |
|---|---|---|---|---|---|---|---|---|---|---|---|---|---|
| 32 | 0.8 | 2.0 | 2.0 | Na | 0.1 | Yb | 0.2 | 0 | 0 | 0.05 | 0.1 | 465 | 13.1 |
| 33 | 0.9 | 2.0 | 2.0 | Na | 0.1 | Ce | 0.1 | 0 | 0 | 0.05 | 0.05 | 480 | 13.5 |
| 34 | 0.8 | 2.0 | 2.0 | Na | 0.1 | Ce | 0.2 | 0 | 0 | 0.05 | 0.1 | 460 | 13.0 |
| 35 | 0.9 | 2.0 | 2.0 | Na | 0.1 | Gd | 0.1 | 0 | 0 | 0.05 | 0.05 | 485 | 13.9 |
| 36 | 0.8 | 2.0 | 2.0 | Na | 0.1 | Gd | 0.2 | 0 | 0 | 0.05 | 0.1 | 470 | 12.9 |
| 37 | 0.9 | 2.0 | 2.0 | Na | 0.1 | Er | 0.1 | 0 | 0 | 0.05 | 0.05 | 475 | 13.4 |
| 38 | 0.8 | 2.0 | 2.0 | Na | 0.1 | Er | 0.2 | 0 | 0 | 0.05 | 0.1 | 470 | 13.0 |
| 39 | 1.0 | 2.0 | 1.9 | Na | 0.05 | Nd | 0.05 | 0.1 | 0 | 0.0263 | 0.0263 | 460 | 13.1 |
| 40 | 1.0 | 2.0 | 1.8 | Na | 0.05 | Nd | 0.05 | 0.2 | 0 | 0.0277 | 0.0277 | 440 | 12.6 |
| 41 | 1.0 | 2.0 | 2.0 | Na | 0.05 | Nd | 0.05 | 0 | 0.005 | 0.025 | 0.025 | 490 | 13.8 |
| 42 | 1.0 | 2.0 | 2.0 | Na | 0.05 | Nd | 0.05 | 0 | 0.01 | 0.025 | 0.025 | 480 | 14.1 |

The $Q_{max}$ factor was determined for each sample under the conditions (calcination temperature, firing temperature, temperature of insulating oil during polarization, and dc voltage) that exhibited the largest $Q_{max}$ factor. The $Q_{max}$ factor depended on the shape of the sample, the mode of vibration and the type of the electrode. The applications of the piezoelectric ceramic device, in particular, a piezoelectric ceramic resonator, at a higher temperature according to the present invention are of very special use, and a high $Q_{max}$ factor as required in general-purpose piezoelectric ceramic devices, in particular, piezoelectric ceramic resonators that are used in household electric appliances, is not required. This is because even a low $Q_{max}$ factor is practicable depending on the circuit design. Under the present conditions, a $Q_{max}$ factor of at least 10 at room temperature is a practical level.

The Curie points in Tables 1 and 2 were determined for each sample under the conditions (calcination temperature and firing temperature) that gave the highest density. When the piezoelectric ceramic device is used at a high temperature close to 400° C., a Curie point of at least 430° C. is required for practical use.

It is apparent from Tables 1 and 2 that the piezoelectric ceramic compositions within the scope of the present invention have Curie points higher than 430° C. and thus are useful materials for piezoelectric ceramic devices, in particular, piezoelectric ceramic resonators at a high temperature close to 400° C.

The samples that are within the scope of the present invention and contain not more than about 0.175 mol (and more than 0 mol) of trivalent metallic elements other than Bi per 1 mol of Nb have $Q_{max}$ factors of not less than the practical level of 10, and thus are useful materials particularly for piezoelectric ceramic resonators.

The piezoelectric ceramic composition according to the present invention is not limited to the embodiment described above, and is effective within the scope of the present invention.

The present invention can be applied not only to the piezoelectric ceramic oscillator 10 described above, but also to other piezoelectric ceramic devices, such as piezoelectric ceramic oscillators, piezoelectric ceramic filters and piezoelectric ceramic resonators.

What is claimed is:

1. A piezoelectric ceramic composition comprising a layered bismuth compound comprising Sr, Bi, Nb and oxygen, and a positive amount of monovalent metallic element, wherein the amount of monovalent metallic element is not more than about 0.125 mol for each mol of Nb.

2. The piezoelectric ceramic composition according to claim 1, wherein the monovalent metallic element is at least one member selected from the group consisting of Li, Na and K.

3. The piezoelectric ceramic composition according to claim 2, wherein the layered bismuth compound further comprises a positive amount of not more than about 0.175 mol of trivalent metallic element other than Bi for each mol of Nb.

4. The piezoelectric ceramic composition according to claim 3, wherein the trivalent metallic element is at least one member selected from the group consisting of Sc, Y, La, Ce, Nd, Sm, Gd, Dy, Er and Yb.

5. The piezoelectric ceramic composition according to claim 3, wherein the trivalent metallic element is Nd.

6. The piezoelectric ceramic composition according to claim 4, further comprising a positive amount Ta up to about 10 molar percent based on the moles of Nb and Ta present.

7. The piezoelectric ceramic composition according to claim 6, further comprising a positive amount Mn up to about 0.01 mol.

8. A piezoelectric ceramic according to claim 7 having a Curie point of at least about 430° C. and a $Q_{max}$ of at least about 10.

9. A piezoelectric ceramic device comprising a piezoelectric ceramic composed of the piezoelectric ceramic composition according to claim 7 in combination with electrodes.

10. The piezoelectric ceramic composition according to claim 1, wherein the layered bismuth compound further comprises a positive amount of not more than about 0.175 mol of trivalent metallic element other than Bi for 1 mol of Nb.

11. A piezoelectric ceramic device comprising a piezoelectric ceramic composed of the piezoelectric ceramic composition according to claim 10 in combination with electrodes.

12. The piezoelectric ceramic composition according to claim 10, wherein the trivalent metallic element is at least one member selected from the group consisting of Sc, Y, La, Ce, Nd, Sm, Gd, Dy, Er and Yb.

13. The piezoelectric ceramic composition according to claim 10, wherein the trivalent metallic element is Nd.

14. A piezoelectric ceramic device comprising a piezoelectric ceramic composed of the piezoelectric ceramic composition according to claim 13 in combination with electrodes.

15. The piezoelectric ceramic composition according to claim 1, further comprising a positive amount Ta up to about 10 molar percent based on the mols of Nb and Ta present.

16. A piezoelectric ceramic device comprising a piezoelectric ceramic composed of the piezoelectric ceramic composition according to claim 15 in combination with electrodes.

17. The piezoelectric ceramic composition according to claim 1, further comprising a positive amount Mn up to about 0.01 mol.

18. A piezoelectric ceramic device comprising a piezoelectric ceramic composed of the piezoelectric ceramic composition according to claim 17 in combination with electrodes.

19. A piezoelectric ceramic device comprising a piezoelectric ceramic composed of the piezoelectric ceramic composition according to claim 1 in combination with electrodes.

20. A piezoelectric ceramic according to claim 1 having a Curie point of at least about 430° C. and a $Q_{max}$ of at least about 10.

* * * * *